United States Patent
Chang et al.

(10) Patent No.: US 6,567,960 B2
(45) Date of Patent: May 20, 2003

(54) SYSTEM FOR IMPROVING CIRCUIT SIMULATIONS BY UTILIZING A SIMPLIFIED CIRCUIT MODEL BASED ON EFFECTIVE CAPACITANCE AND INDUCTANCE VALUES

(75) Inventors: Norman Chang, Fremont, CA (US); Yu Cao, Richmond, CA (US); Osamu Samuel Nakagawa, Redwood City, CA (US); Shen Lin, Foster City, CA (US); Weize Xie, Cupertino, CA (US)

(73) Assignee: Hewlett-Packard Development L.P., Houston, TX (US)

( * ) Notice: Subject to any disclaimer, the term of this patent is extended or adjusted under 35 U.S.C. 154(b) by 0 days.

(21) Appl. No.: 09/972,052

(22) Filed: Oct. 9, 2001

(65) Prior Publication Data

US 2003/0070148 A1 Apr. 10, 2003

(51) Int. Cl.[7] .............................................. G06F 17/50
(52) U.S. Cl. ........................ 716/5; 716/6; 716/3; 716/1
(58) Field of Search ........................................ 716/1–21

(56) References Cited

U.S. PATENT DOCUMENTS

| | | | |
|---|---|---|---|
| 6,311,313 B1 | * | 10/2001 | Camporese et al. ........... 716/6 |
| 6,314,546 B1 | * | 11/2001 | Muddu .......................... 716/5 |
| 6,425,117 B1 | * | 7/2002 | Pasch et al. .................. 716/21 |
| 2002/0095646 A1 | * | 7/2002 | Ohkubo ......................... 716/6 |

* cited by examiner

Primary Examiner—Matthew Smith
Assistant Examiner—Magid Y Dimyan

(57) ABSTRACT

An RLC module is configured to provide a simplified circuit modeling of a selected circuit net (or portion) of an electronic circuit. The RLC module may be configured to substitute an RLC circuit model for the selected circuit net, where the effective values of the capacitance and inductance for the RLC circuit model are retrieved from a table of capacitance and inductance values. A set of interconnect geometry factors (e.g., line length, line width, driver/receiver length, etc.) that describes the circuit net is used as an index into the table of capacitance and inductance values. The retrieved values of the effective capacitance and inductances values may be used to calculate a delay for the RLC circuit model. The RLC module may provide the capability to quickly calculate a delay for a selected circuit net without using computationally intensive calculations for inductance and capacitance values of circuit nets.

20 Claims, 4 Drawing Sheets

SYSTEM FOR IMPROVING CIRCUIT SIMULATIONS BY UTILIZING A SIMPLIFIED CIRCUIT MODEL BASED ON EFFECTIVE CAPACITANCE AND INDUCTANCE VALUES

FIELD OF THE INVENTION

This invention relates generally to circuit simulations, and more particularly to improving circuit simulations by utilizing a simplified circuit model based on effective capacitance and inductance values.

DESCRIPTION OF THE RELATED ART

It has become well accepted that on-chip interconnect delays dominate gate delay in current deep sub-micrometer VLSI circuits. With the continuous scaling of VLSI technology and increased die area, this behavior is expected to continue. In order to properly design complex circuits, more accurate interconnect models and signal propagation characterizations are required.

Historically, on-chip interconnects have been modeled as a single lumped capacitance in the analysis of on-chip interconnects. With the scaling of technology and increased chip sizes, the cross sectional area of wires has been scaled down while on-chip interconnect lengths have increased. The resistance of the on-chip interconnects has increased in significance, requiring the use of more accurate RC delay models. Many design techniques have therefore been developed to minimize the propagation delay of on-chip interconnects. Repeaters are often used to minimize the delay to propagate a signal through those interconnect lines that are best modeled as an RC impedance.

Currently, inductance is becoming more important with faster on-chip rise times and longer wire lengths. Wide wires are frequently encountered in clock distribution networks and in upper metal layers. These wires are low resistive wires that can exhibit significant inductive effects. With these trends, it is becoming more important to include inductance when modeling on-chip interconnects.

Moreover, when the chip operation frequency approaches one (1) Gigahertz or higher, inductance effect becomes significant, especially on global signal lines. Compared to conventional RC line model, the inclusion of inductance, L, can cause thirty (30) percent more delay than the simple RC case. Further, the faster rising time due to inductance effect generates a much larger coupling noise on the neighboring circuits. For these reasons, an accurate RLC line model is important for correct chip design.

Due to the long range coupling characteristics of mutual inductance, a full inductance matrix is usually used in simulation for multiple signal line cases, which increases the simulation time when the number of signal lines is large. More specifically, to minimize global signal line delay with repeater insertion, engineers usually model the multiple signal lines as a single signal line with an effective RC value for the worst case switching impact from the neighboring lines.

In this simplified single line model, a traditionally effective capacitance (Ceff) and an additional effective loop inductance (Leff) are introduced to deal with the condition of the formerly coupled lines. Leff should equivalently represent the extra delay and noise caused by inductance effect. Moreover, the non-linear dependence of inductance coupling with delay should also be taken into account.

With the increasing circuit operation frequency, inductance effects on line delay and signal operation frequency become more important for chip design. Currently, multiple RLC signal lines are modeled by the full self and/or mutual inductance matrix, which is computationally costly and time consuming. Thus, an accurate and efficient on-chip inductance model is necessary for delay estimation and particularly for repeater insertion.

SUMMARY OF THE INVENTION

In accordance with the principles of the present invention, one aspect of the invention pertains to a method of improving circuit simulations. The method includes generating a table of a plurality of effective capacitance values and a plurality of effective inductance values, each effective capacitance value and each effective inductance value being indexed by a respective set of a plurality of interconnect geometry parameters and searching for an effective capacitance value and an effective inductance value in the table based on a set of measured interconnect geometry parameters of the circuit net. The method also includes calculating a delay in response to the effective capacitance value and the effective inductance and simulating the circuit net with the delay.

Another aspect of the present invention relates to a method of modeling a circuit. The method includes determining a portion of the circuit to model and determining a set of interconnect geometry parameters of the portion of the circuit. The method also includes retrieving an effective capacitance value and an effective inductance value for the portion of the circuit based on the set of interconnect geometry parameters being an index value into a table of effective capacitances and inductances and modeling the portion of the circuit as a simplified circuit based on the effective capacitance value and the effective inductance value.

Another aspect of the present invention pertains to a system for improving circuit simulations. The system includes at least one processor, a memory coupled to the at least one processor and a simplified circuit module. The simplified circuit module resides in the memory and is executed by the at least one processor. The simplified circuit module is configured to generate a table of a plurality of effective capacitance values and a plurality of effective inductance values, each effective capacitance value and each effective inductance value being indexed by a respective set of interconnect geometry parameters. The simplified circuit module is also configured to search for an effective capacitance value and an effective inductance value in the table based on a set of measured interconnect geometry parameters of the circuit net and the simplified circuit module is further configured to calculate a delay in response to the effective capacitance value and the effective inductance value. The simplified circuit module is further configured to simulate the circuit net with the delay.

Yet another aspect of the present invention utilizes a computer readable storage medium on which is embedded one or more computer programs. The one or more computer programs implement a method of improving circuit simulations. The one or more computer programs include a set of instructions for generating a table of a plurality of effective capacitance values and a plurality of effective inductance values, each effective capacitance value and each effective inductance value being indexed by a respective set of interconnect geometry parameters. The method also includes searching for an effective capacitance value and an effective inductance value in the table based on a set of measured interconnect geometry parameters of the circuit net and calculating a delay in response to the effective capacitance value and the effective inductance value. The method further includes simulating the circuit net with the delay.

BRIEF DESCRIPTION OF THE DRAWINGS

Various objects, features, and aspects of the present invention can be more fully appreciated as the same become better understood with reference to the following detailed description of the present invention when considered in connection with the accompanying drawings, in which.

DETAILED DESCRIPTION OF A PREFERRED EMBODIMENT

Figure 1:
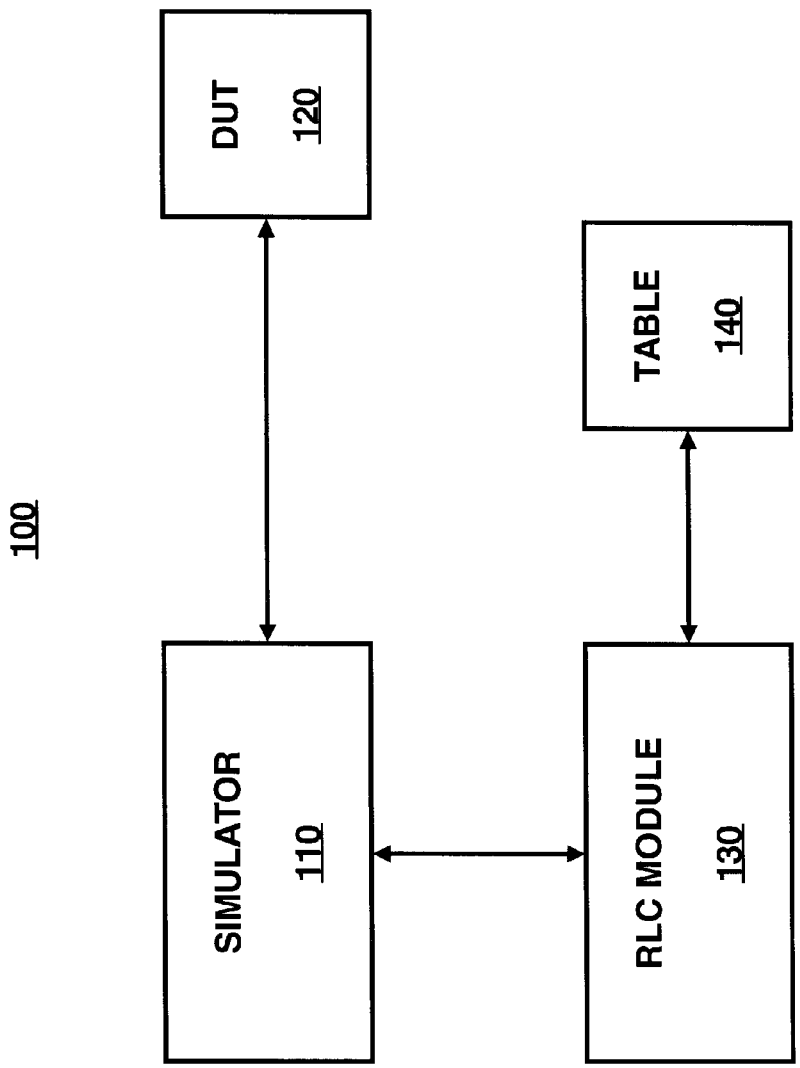
FIG. 1 illustrates a block diagram of an exemplary embodiment of a system including an embodiment of the present invention.

For simplicity and illustrative purposes, the principles of the present invention are described by referring mainly to an exemplary embodiment of a resistance-inductance-capacitance (RLC) module (or simplified circuit module). However, one of ordinary skill in the art would readily recognize that the same principles are equally applicable to all types of circuit simulations, and that any such variation does not depart from the true spirit and scope of the present invention. Moreover, in the following detailed description, references are made to the accompanying drawings, which illustrate specific embodiments in which the present invention may be practiced. Electrical, mechanical, logical and structural changes may be made to the embodiments without departing from the spirit and scope of the present invention. The following detailed description is, therefore, not to be taken in a limiting sense and the scope of the present invention is defined by the appended claims and their equivalents.

According to a disclosed embodiment of the present invention, an RLC module may be utilized to improve the simulation efficiency of a circuit simulator. In particular, the RLC module may provide the capability to determine delay caused by RLC effects in a circuit net, e.g., an on-chip interconnect run in a VLSI device. The RLC module provides for a table of capacitance and inductance values, which may be indexed by a set of interconnect geometry parameters such as line length, line width, driver/receiver length, etc. In effect, the table of capacitance and inductance may be configured to provide an effective capacitance value and effective inductance value for a given set of interconnect geometry parameters. The values for the table of capacitance and inductance values (or look-up table) may be generated by a simulation program (e.g., RAPHAEL, FASTHENRY, etc.), actual measurements of circuits or combination thereof.

Another aspect of the present invention provides for simulating a given circuit net (or circuit portion) by a simplified RLC circuit model, which is specified by an effective capacitance value and an effective inductance value. A set of interconnect geometry factors that describe the given circuit net are used as an index in the table of capacitance and inductance values. For those sets of interconnect geometry factors that are not explicitly listed in the look-up table, interpolation techniques (e.g., a multi-dimensional spline interpolation, nearest neighbor interpolation, Euclidean interpolation, etc.) may be used to determine (estimate) for those in-between values. The RLC module may be configured to retrieve (or derived) an effective capacitance value and effective inductance value, which are used to calculate a delay for the simplified circuit model, thereby eliminating lengthy capacitance and inductance values calculation times with conventional systems. Accordingly, simulations of the circuit may be performed more quickly.

One application for an embodiment of the present invention is for the insertion of repeaters in global interconnects and simulation of the delay in between the repeaters. Since the delay may be quickly referenced in the table of capacitance and inductance values, the overall simulation time may be decreased as there are no lengthy calculations to perform.

FIG. 1 illustrates a block diagram of an exemplary embodiment of a simulation system 100 including a RLC module 130 in accordance with the principles of the present invention. Although, for illustrative purposes only, FIG. 1 illustrates an exemplary embodiment of the simulation system 100, it should be readily apparent to those of ordinary skill in the art that FIG. 1 represents a generalized schematic illustration of the simulation system 100 and that other components may be added or existing components may be removed without departing from the spirit or scope of the present invention. Moreover, since FIG. 1 illustrates an exemplary embodiment of the simulation system 100, the simulation system 100 may be implemented as hardware, software, and/or other embodiments and are well within the scope and spirit of the present invention.

As shown in FIG. 1, the simulation system 100 includes a simulator module 110 and a device under test (DUT) 120. The simulator module 110 may be configured to provide the capability of simulating timing of electronic circuits on a computing platform. The electronic circuits may be simple circuit primitives to complex electronic circuits such as controllers, digital signal processors, microprocessors or other similar electronic devices. The simulator module 110 may be implemented as part of a simulation software such as SPICE, MICRO-CAP, etc. Alternatively, the simulator module 110 may be implemented as a computer program based on analytical equations or a look-up table.

The DUT 120 may be an electronic circuit configured for simulation by the simulator module 110. The DUT 120 may be represented as a file containing data that describes the electronic circuit. In particular, the file (or multiple files) may contain transistor descriptions along with interconnect geometry parameters (e.g., length, width, spacing, etc.). The parts of the file describing the interconnect geometry may then be used by an RLC module 130 to substitute a simplified RLC model for the given electronic circuit.

In accordance with the principles of the present invention, the RLC module 130 may be configured to provide a simplified circuit modeling of a selected circuit net (or portion) of the DUT 120. Specifically, the RLC module 130 may be configured to substitute an RLC circuit model for the selected circuit net, where the effective values of the capacitance and inductance for the RLC circuit model may be retrieved from a table of capacitance and inductance values 140 indexed by the interconnect geometry parameters (or factors).

In another aspect of the present invention, a set of interconnect geometry factors (e.g., line length, line width, driver/receiver length, etc.) that describe the circuit net may be used as an index into the table of capacitance and inductance values 140. The retrieved values of the effective capacitance and inductances values may be used to calculate a delay for the RLC circuit model. Thus, the RLC module 130 may provide the capability to quickly calculate a delay for a selected circuit net without using computationally intensive calculations for inductance and capacitance values of circuit nets, as described herein above.

Figure 2:
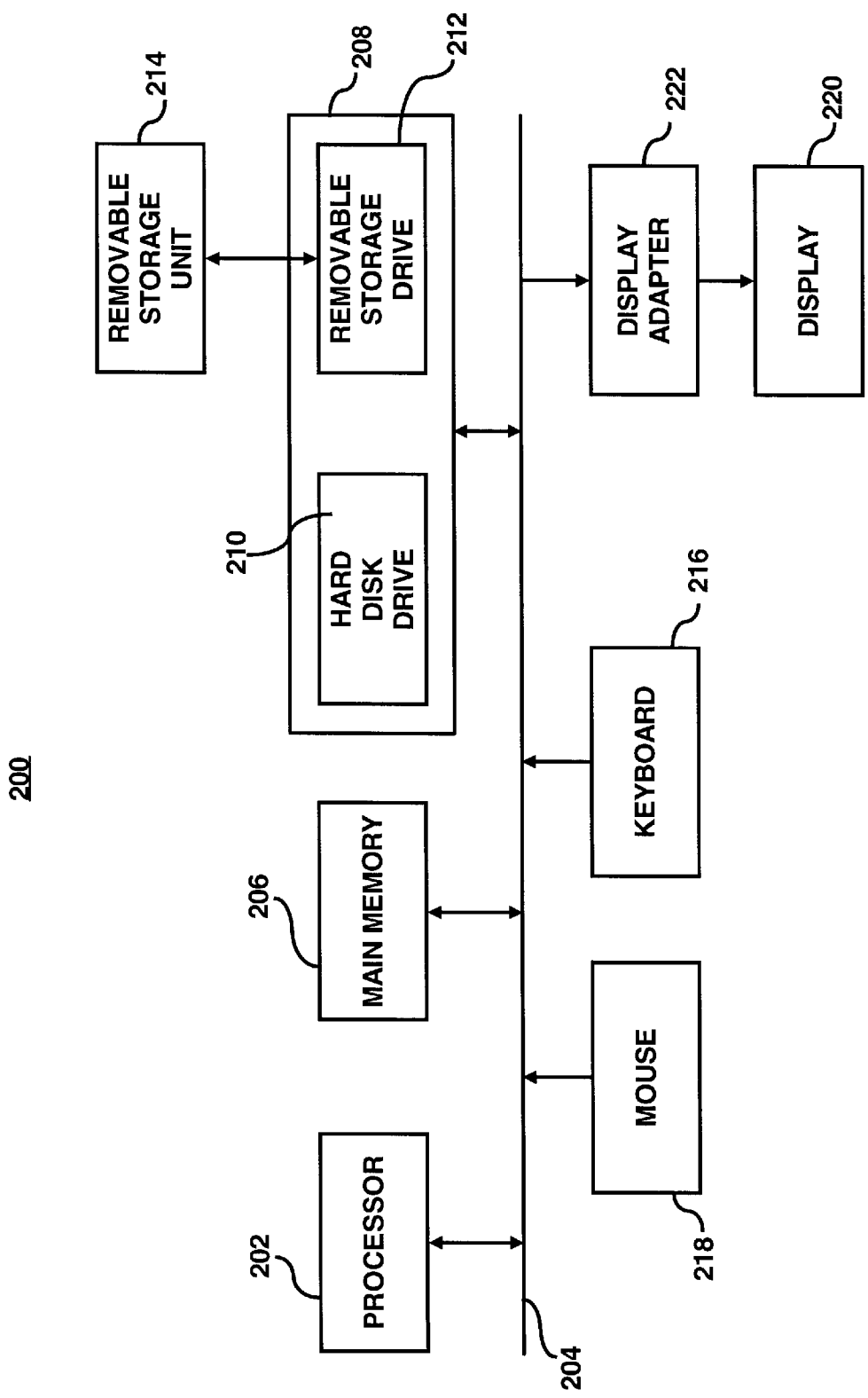
FIG. 2 illustrates an exemplary block diagram of a computing platform configured to execute a computer program embodiment of the present invention.

FIG. 2 illustrates an exemplary block diagram of a computer system 200 where a preferred embodiment of the present invention may be practiced. The functions of the RLC module 130 may be implemented in program code and executed by the computer system 200. The RLC module 130 may be implemented in computer languages such as PASCAL, C, C++, JAVA, etc.

As shown in FIG. 2, the computer system 200 includes one or more processors, such as processor 202 that provides an execution platform for the RLC module 130. Commands and data from the processor 202 are communicated over a communication bus 204. The computer system 200 also includes a main memory 206, preferably Random Access Memory (RAM), where the software for the RLC module 130 may be executed during runtime, and a secondary memory 208. The secondary memory 208 includes, for example, a hard disk drive 210 and/or a removable storage drive 212, representing a floppy diskette drive, a magnetic tape drive, a compact disk drive, etc., where a copy of a computer program embodiment for the RLC module 130 may be stored. The removable storage drive 212 reads from and/or writes to a removable storage unit 214 in a well-known manner. A user interfaces with the RLC module 130 with a keyboard 216, a mouse 218, and a display 220. The display adaptor 222 interfaces with the communication bus 204 and the display 220 and receives display data from the processor 202 and converts the display data into display commands for the display 220.

Figure 3:
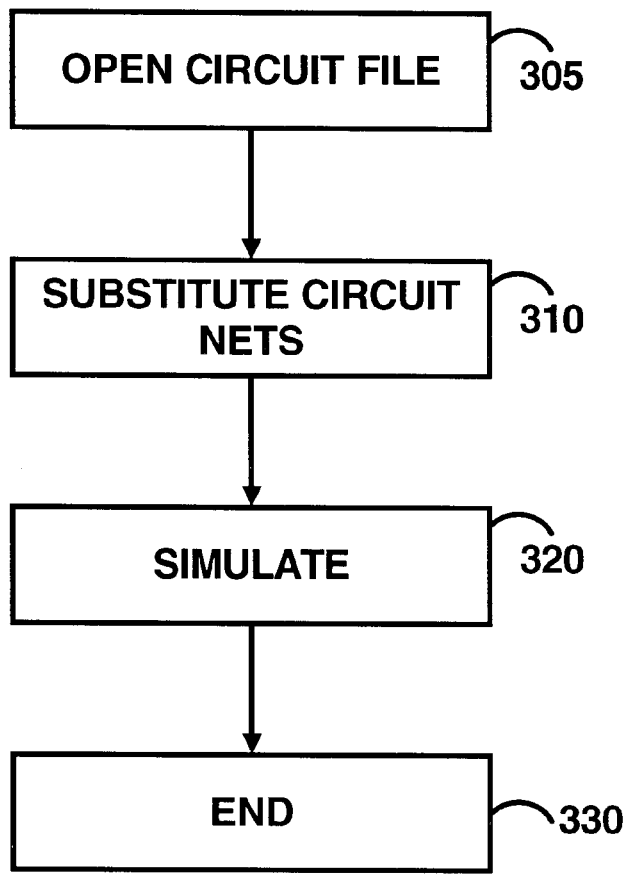
FIG. 3 illustrates an exemplary flow diagram of the system shown in FIG. 1 in accordance with an embodiment of the present invention.

FIG. 3 illustrate an exemplary flow diagram 300 of the simulation system 100 utilizing the RLC module 130 shown in FIG. 1 in accordance with the principles of the present invention. Although, for illustrative purposes only, FIG. 3 illustrates a flow diagram for a simulation system utilizing the RLC module with the following steps, it should be readily apparent to those of ordinary skill in the art that FIG. 3 represents a generalized illustration of an embodiment of the simulation system 100 and that other steps may be added or existing steps may be removed without departing from the spirit or scope of the present invention.

As shown in FIG. 3, the simulation system 100 may be configured to open a file containing data related to the DUT 120, in step 305. The file may contain component and interconnection data about the DUT 120.

In step 310, the simulation system 100 may be configured to parse the opened file and search for circuit nets that may be candidates for substitution of a simplified RLC circuit model by utilizing the RLC module 130. The criterion for substitution may be user determined. For example, an interconnect run above a certain length may be a criterion for substitution.

After substitution of the simplified RLC circuit model for the selected circuit net, the simulation system 100 may be configured to simulate the DUT 120 utilizing the simulator module 110, in step 320. Subsequently, the simulation system 100 may be configured to end, in step 330.

Figure 4:
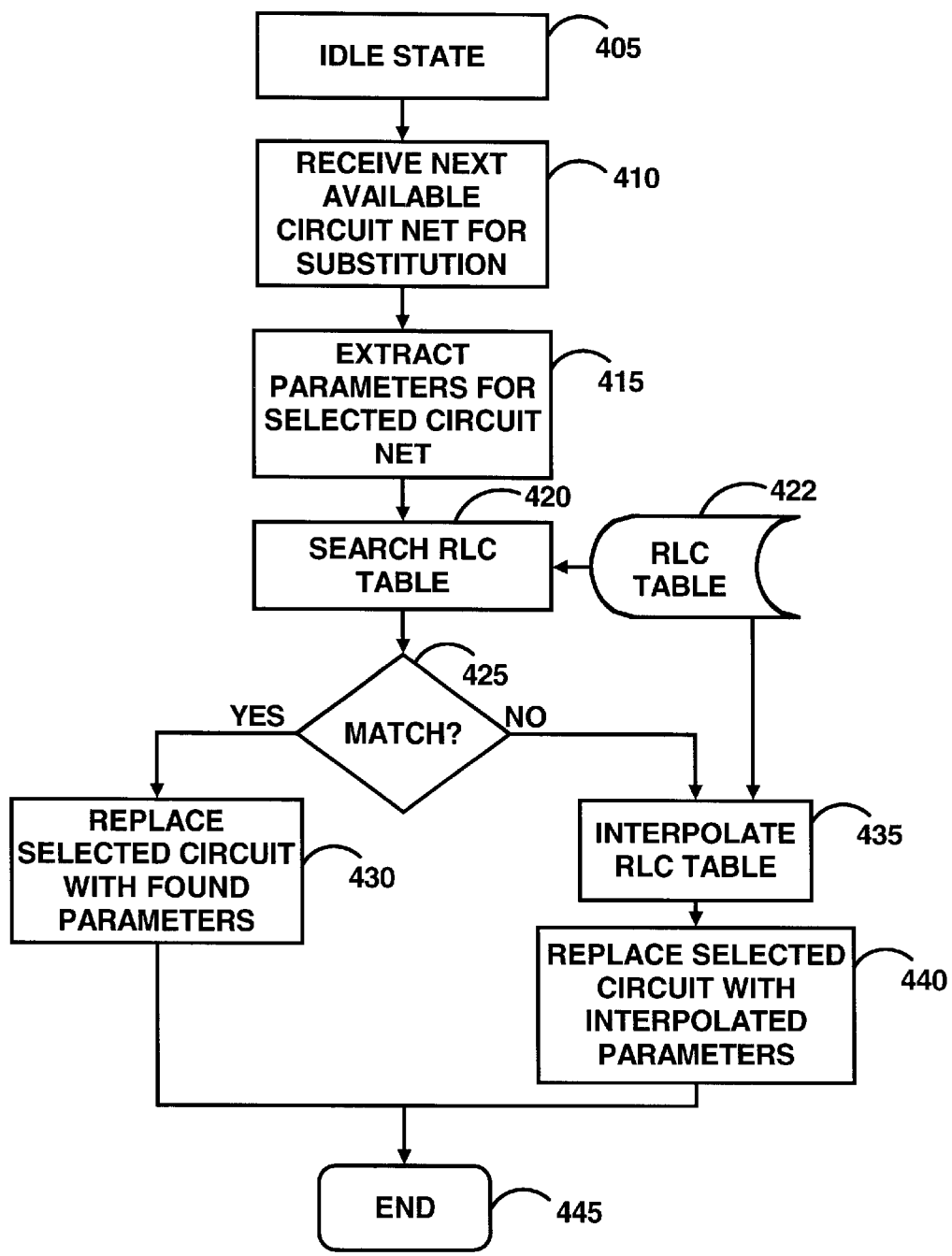
FIG. 4 illustrates an exemplary flow diagram of the RLC module shown in FIG. 1 in accordance with an embodiment of the present invention.

FIG. 4 illustrates an exemplary flow diagram 400 of the RLC module 130 of FIG. 1 in accordance with the principles of the present invention. Although, for illustrative purposes only, FIG. 4 illustrates a flow diagram for the RLC module with the following steps, it should be readily apparent to those of ordinary skill in the art that FIG. 4 represents a generalized illustration of an embodiment of the RLC module 130 and that other steps may be added or existing steps may be removed without departing from the spirit or scope of the present invention.

As shown in FIG. 4, the RLC module 130 may be configured to be in an idle state in step 405. As the simulation system 100 determines candidate circuit nets that are eligible for substitution with the simplified RLC circuit model, the RLC module 130, in step 410, may receive the selected circuit net.

The RLC module 130, in step 415, may be configured to extract a set of interconnect geometry parameters (or factors) that describe the selected circuit net, such as line length, line width, driver/receiver length, etc. Alternatively, the RLC module 130 may receive the set of interconnect geometry parameters from the simulation system 100.

In step 420, the RLC module 130 may be configured to search the table of capacitance and inductance values (RLC table) 422 with the set of interconnect geometry factors as an index into the RLC table 422, which may be stored in an appropriate memory location (not shown) of the simulation system 100. The values for the RLC table 422 may be generated by a simulation program (e.g., SPICE, VHDL, etc.) and/or actual measurements of circuits. Table I illustrates an exemplary embodiment of values for the RLC table 422.

TABLE I

| Layer Width ($\mu$m) | Space ($\mu$m) | Length ($\mu$m) | R (ohm) | L (nH) | C (fF) |
| --- | --- | --- | --- | --- | --- |
| 0.5 | 0.5 | 2000 | 40 | 0.02 | 0.2 |
| 1.0 | 1.0 | 3000 | 30 | 0.03 | 0.18 |
| 2.0 | 1.5 | 4000 | 20 | 0.04 | 0.17 |

In step 425, the RLC module 130 may be configured to determine whether the set of interconnect geometry factors (or parameters) matches any of the index values of the RLC table 422. If there is match, an effective capacitance value and an effective inductance value are retrieved from the RLC table 422, which are then used as values for a simplified RLC circuit model, in step 430.

Returning to step 425, if a match does not exist between the set of interconnect geometry factors and any of the index values of the RLC table 422, the RLC module 130 may be configured to perform an interpolation operation to obtain an effective capacitance value and an effective inductance value for the set of environment factors that is in-between the values of the RLC table 422. The interpolation operation may be a multi-dimensional spline interpolation, such as a cubic spline interpolation if there are three interconnect geometry factors describing the selected circuit net. Although, purely for illustrative purposes, multi-dimensional spline interpolation operation is used to derive the in-between effective capacitance and inductance values, it should be readily apparent to those skilled in the art that other interpolation techniques (e.g., straight line interpolation, nearest neighbor interpolation, Euclidean interpolation, gradient estimation, etc.) may be used without departing from the spirit or scope of the present invention.

In step 440, the values for the effective capacitance and inductance may be utilized in a simplified RLC circuit model for the simulator module 110. Subsequently, the RLC module 130 may be configured to end, in step 445.

According to an embodiment of the present invention, an RLC module is configured to provide a simplified circuit modeling of a selected circuit net (or portion) of an electronic device. The RLC module may be configured to substitute an RLC circuit model for the selected circuit net, where the effective values of the capacitance and inductance for the RLC circuit model are retrieved from a table of capacitance and inductance values. A set of interconnect geometry factors (e.g., line length, line width, length, etc.) that describes the circuit net is used as an index into the table of capacitance and inductance values. The retrieved values of the effective capacitance and inductance values may be used to calculate a delay for the RLC circuit model. Thus, the RLC module may provide the capability to quickly calculate a delay for a selected circuit net without using computationally intensive calculations for inductance and capacitance values of circuit nets.

While the invention has been described with reference to the exemplary embodiments thereof, those skilled in the art will be able to make various modifications to the described embodiments of the invention without departing from the true spirit and scope of the invention. The terms and descriptions used herein are set forth by way of illustration only and are not meant as limitations. In particular, although the method of the present invention has been described by examples, the steps of the method may be performed in a different order than illustrated or simultaneously. Those skilled in the art will recognize that these and other variations are possible within the spirit and scope of the invention as defined in the following claims and their equivalents.

What is claimed is:

1. A method of improving circuit simulations, comprising:
   generating a table of a plurality of effective capacitance values and a plurality of effective inductance values, each effective capacitance value and each effective inductance value being indexed by a respective set of interconnect geometry parameters;
   searching for an effective capacitance value and an effective inductance value in said table based on a set of interconnect geometry parameters of a circuit net;
   calculating a delay in response to said effective capacitance value and said effective inductance value; and
   simulating said circuit net with said delay.

2. The method according to claim 1, further comprising:
   interpolating said effective capacitance value and said effective inductance value in response to said set of interconnect geometry parameters of said circuit net being between said respective sets of interconnect geometry parameters.

3. The method according to claim 2, wherein said interpolating is performed utilizing a multi-dimensional spline interpolation.

4. The method according to claim 1, wherein one interconnect geometry parameter of said plurality of interconnect geometry factors includes at least one of a line length, a line width, a driver length, and a receiver length.

5. The method according to claim 1, further comprising:
   modifying said circuit net in response to a result of said simulation with said delay being below a predetermined performance level; and
   repeat searching for a second effective capacitance value and a second effective inductance value for said modified circuit net.

6. The method according to claim 5, further comprising:
   recalculating a second delay in response to said second effective capacitance value and said second effective inductance value; and
   repeat simulating said modified circuit with said second delay.

7. A method of modeling a circuit, comprising:
   determining a portion of said circuit to model;
   determining a set of interconnect geometry parameters of said portion of said circuit; and
   retrieving an effective capacitance value and an effective inductance value for said portion of said circuit based on said set of interconnect geometry parameters being an index value into a table of effective capacitances and inductances; and
   modeling said portion of said circuit as a simplified circuit based on said effective capacitance value and said effective inductance value.

8. The method according to claim 7, further comprising:
   interpolating said effective capacitance value and said effective inductance value in response to said set of interconnect geometry parameters of said portion of said circuit being in between index values into said table of effective capacitances and inductances.

9. The method according to claim 8, wherein said interpolating utilizes a multi-dimensional interpolation technique.

10. The method according to claim 7, further comprising:
    calculating a delay in response to said effective capacitance value and said effective inductance value, wherein said delay is used in modeling said portion of said circuit.

11. A system for improving circuit simulations, comprising:
    at least one processor;
    a memory coupled to said at least one processor; and
    a simplified circuit module residing in said memory and said simplified circuit module executed by said at least one processor, wherein said simplified circuit module is configured to:
    generate a table of a plurality of effective capacitance values and a plurality of effective inductance values, each effective capacitance value and each effective inductance value being indexed by a respective set of interconnect geometry parameters;
    search for an effective capacitance value and an effective inductance value in said tabled based on a set of interconnect geometry parameters of said circuit net;
    calculate a delay in response to said effective capacitance value and said effective inductance value; and
    simulate said circuit net with said delay.

12. The system according to claim 11, wherein said simplified circuit module is configured to interpolate said effective capacitance value and said effective inductance value in response to said set of interconnect geometry parameters of said circuit net being between said respective sets of interconnect geometry parameters.

13. The system according to claim 12, wherein said interpolating is performed utilizing a multi-dimensional interpolation technique.

14. The system according to claim 11, wherein one interconnect geometry parameter of said set of interconnect geometry factors includes at least one of a line length, a line width, a driver length, and a receiver length.

15. The system according to claim 11, wherein said simplified circuit module is further configured to modify said circuit net in response to a result of said simulation with said delay being below a predetermined performance level and said simplified circuit module is further configured to repeat search for a second effective capacitance value and a second effective inductance value for said modified circuit net.

16. The system according to claim 15, wherein said simplified circuit module is further configured to recalculate a second delay in response to said second effective capacitance value and said second effective inductance value and said simplified circuit module is further configured to repeat simulation of said modified circuit with said second delay.

17. A computer readable storage medium on which is embedded one or more computer programs, said one or more computer programs implementing a method of improving circuit simulations, said one or more computer programs comprising a set of instructions for:

generating a table of a plurality of effective capacitance values and a plurality of effective inductance values, each effective capacitance value and each effective inductance value being indexed by a respective set of interconnect geometry parameters;

searching for an effective capacitance value and an effective inductance value in said table based on a set of interconnect geometry parameters of a circuit net;

calculating a delay in response to said effective capacitance value and said effective inductance value; and simulating said circuit net with said delay.

18. The computer readable storage medium in according to claim 17, said one or more computer programs further comprising a set of instructions for:

interpolating said effective capacitance value and said effective inductance value in response to said set of interconnect geometry parameters of said circuit net being between said respective sets of interconnect geometry parameters.

19. The computer readable storage medium in according to claim 18, said one or more computer programs further comprising a set of instructions for:

performing said step of interpolating utilizing a multi-dimensional interpolation technique.

20. The computer readable storage medium in according to claim 17, said one or more computer programs further comprising a set of instructions for:

specifying one interconnect geometry parameter of said plurality of interconnect geometry factors as being at least one of a line length, a line width, a driver length, and a receiver length.

* * * * *